(12) United States Patent
Jang

(10) Patent No.: US 7,420,873 B2
(45) Date of Patent: Sep. 2, 2008

(54) SIMPLIFIED POWER-DOWN MODE CONTROL CIRCUIT UTILIZING ACTIVE MODE OPERATION CONTROL SIGNALS

(75) Inventor: Ji Eun Jang, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 49 days.

(21) Appl. No.: 11/652,786

(22) Filed: Jan. 12, 2007

(65) Prior Publication Data

US 2007/0183251 A1 Aug. 9, 2007

(30) Foreign Application Priority Data

Jan. 13, 2006 (KR) .................. 10-2006-0003976

(51) Int. Cl.
*G11C 7/22* (2006.01)
*G11C 8/18* (2006.01)

(52) U.S. Cl. .............. 365/233.1; 365/233.12; 365/233.15; 365/233.14; 365/227

(58) Field of Classification Search ............... 365/233, 365/226–229
See application file for complete search history.

(56) References Cited

U.S. PATENT DOCUMENTS

| | | | |
|---|---|---|---|
| 5,623,453 A | * | 4/1997 | Shinozaki ............. 365/233.15 |
| 6,088,290 A | | 7/2000 | Ohtake et al. |
| 6,144,613 A | * | 11/2000 | Matsubara ............... 365/233.1 |
| 6,266,294 B1 | * | 7/2001 | Yada et al. ............. 365/233.14 |
| 6,466,075 B2 | * | 10/2002 | Douchi et al. ............... 327/296 |
| 6,594,770 B1 | * | 7/2003 | Sato et al. .................... 713/320 |

FOREIGN PATENT DOCUMENTS

| | | |
|---|---|---|
| JP | 09-069285 | 3/1997 |
| KR | 102000 0006054 | 1/2000 |
| KR | 102000 0035757 | 6/2000 |

OTHER PUBLICATIONS

Korean Patent Gazette, Feb. 9, 2007.

* cited by examiner

*Primary Examiner*—Huan Hoang
*Assistant Examiner*—Michael J Weinberg
(74) *Attorney, Agent, or Firm*—Ladas & Parry LLP

(57) ABSTRACT

A power-down control circuit utilizes the control signals employed in an active mode operation to operate when a power-down mode entry command is received during an active mode operation. The circuit is simplified requiring less area for devising the control circuit while lowering power consumption. The power-down control circuit in a semiconductor memory device includes at least a clock enable buffer unit, an external clock buffer unit, a latch unit, a control circuit for controlling internally operating clocks employed in active mode operation by using a control signal used in the active mode operation when a power-down mode entry command is received during the active mode operation, and a clock enable generation circuit for outputting clock enable signals for enabling entry to the power-down mode by using the clock control signals, when the external clock pulse signal is low level.

20 Claims, 8 Drawing Sheets

SIMPLIFIED POWER-DOWN MODE CONTROL CIRCUIT UTILIZING ACTIVE MODE OPERATION CONTROL SIGNALS

CROSS-REFERENCE TO RELATED APPLICATIONS

The present application claims priority to Korean patent application number 10-2006-0003976 filed on Jan. 13, 2006, which is incorporated herein by reference in its entirety.

BACKGROUND OF THE INVENTION

The present invention relates to a semiconductor memory device and more particularly to a power-down mode control circuit for controlling the internal operation clocks in order to enter into a power-down mode during an active mode operation.

In general, a semiconductor memory device is designed to achieve high cell capacity, high operational speed, and low power consumption. A power-down mode is available in a semiconductor memory device to minimize the amount of driving current consumed when data access operations are not performed.

FIG. 1 is a timing diagram showing the conventional entry and exit timing of a power-down mode in a conventional semiconductor memory device.

In a conventional semiconductor memory device of FIG. 1, a clock enable signal CKE is changed from a high level to a low level when entering into a power-down mode, and the clock enable signal CKE is changed from a low level to a high level when exiting from the power-down mode.

The clock enable signal CKE interfaces with the external chipset even during a power-down mode of the semiconductor memory device and serves as a reference signal for determining whether to transmit the clock signal CLK (which is inputted from the external chipset) to the semiconductor memory's core region.

FIG. 2 is a timing diagram explaining the conventional way of entering into a power-down mode from a read operation in a conventional semiconductor memory device. FIG. 3 is a timing diagram explaining the conventional way of entering into a power-down mode from a write operation in a conventional semiconductor memory device. FIG. 4 is a timing diagram explaining the conventional way of entering into a power-down mode from a write operation with an auto-precharge command in a conventional semiconductor memory device.

It is noted that the operations for entering into a power-down mode from a read operation with an auto-precharge command (ie., read with autoprecharge) is same as the operations for entering into a power-down mode from a read operation, and thus the description for the above will not be made in a redundant manner.

Referring to FIGS. 2-4, 'DQ_BL8' is a data signal inputted when a burst length is 8, and 'DQ_BL4' is a data signal inputted when a burst length is 4. Further, 'RL' denotes a read latency; 'WL' denotes a write latency; and 'tRDPDEN' denotes a time between the start of read operation and the point of entry to the power-down mode. 'tWRPDEN' denotes the time between the start of a write operation and the point of entry to the power-down mode; 'tWTR' (i.e., a write to read command delay) denotes the time required for processing the inputted data (that is, the time needed for the write data processing); and 'tWR' denotes a write recovery time.

Conventionally as shown in FIGS. 2-4, when a power-down mode entry command is received while an active mode operation (i.e., a read operation, a read operation with an auto-precharge command, a write operation, or a write operation with an auto-precharge command) is in progress, the entry to the power-down mode is implemented after completing the active mode operation in progress.

That is, when a conventional semiconductor memory device enters into a power-down mode, all input buffers are turned off to decrease current consumption, and all internally operating clocks are also disabled, except the clocks associated with the active mode operation in progress. If the power-down mode entry command is received during an active mode operation, the clock(s) associated with the active mode operation in progress is not disabled in order to complete the active mode operation in progress.

Therefore, when the power-down mode entry command is received in a conventional memory device during an active mode, the internally operating clocks are selectively controlled in order to enter into a power-down mode, and the control is conducted using the control signals outputted from a circuit provided in the semiconductor memory device that generates the clock enable signals. In other words, when the conventional semiconductor memory device enters into a power-down mode, all clocks operating in the conventional memory device are disabled using the various types of clock enable signals cke_com, cke_clk, and cke_com1, all of which are outputted from a power-down mode control circuit.

Here, the clock enable signal cke_com is the signal for turning off the commands and the address buffers; the clock enable signal cke_clk is the signal for disabling internally operating clocks excluding those employed in the active mode operation; and the clock enable signal cke_com1 is the signal for disabling the internally operating clocks employed in the active mode operation and a delay locked loop (DLL) clock.

Further, in a conventional semiconductor memory device as shown in FIG. 5, when the power-down mode entry command is received during an active mode operation, the clock enable signal cke_com1 is maintained in a disabled state (that is, in a low level), and then the clock enable signal cke_com1 is changed to an enabled state (that is, in a high level) after completing the active mode operation to disable the internally operating clocks operated in the active mode operation and in association with the DLL.

Hence, a conventional power-down mode control circuit in a semiconductor memory device requires a control circuit (not shown) for outputting the clock enable signal cke_com1 of high level at the time of completing the active mode operation. The conventional control circuit for outputting the clock enable signal cke_com1 receives signals including a CAS pulse signal casp6 of a high level pulse outputted during read and write operations; a CAS latency CL for a read operation; a write latency WL for a write operation; and a write recovery time tWR for auto-precharge.

The conventional control circuit uses the above-mentioned signals (i.e., the CAS pulse signal casp6, the CAS latency CL, the write latency WL, and the write recovery time tWR) to output a control signal cke_ctrl by counting each of them starting from each command to know the time at which the active mode operation is complete. Accordingly, a conventional semiconductor memory device enables the clock enable signal cke_com1 at the time of completing the active mode operation using the control signal cke_ctrl outputted from the control circuit.

Therefore, the control circuit is required to count each of the CAS pulse signal casp6, the CAS latency CL, the write latency WL, and the write recovery time tWR since the beginning of each command.

To perform such counting operations, the control circuit requires: a plurality of D flip-flops for counting the CAS latency CL; a plurality of D flip-flops for counting the write latency WL; and a plurality of D flip-flops for counting the write recovery time tWR; and multiplexers for the respective D flip-flops, all of which could result in several tens of D flip-flops depending on the specification for the CAS latency CL, write latency WL, and the write recovery time tWR.

Because a conventional memory device requires a plurality of D flip-flops and a plurality of multiplexers in the control circuit, a wide area must be set aside to devise the power-down mode control circuit having the above-mentioned control circuit utilizing the D flip-flops.

Further, this increases the current consumption to drive the D flip-flops and multiplexers in a conventional power-down mode control circuit.

SUMMARY OF THE INVENTION

Accordingly, the present invention solves the problems occurring in the related art. The present invention provides a power-down mode control circuit wherein, when a power-down mode entry command is received, control of entry to a power-down mode after completion of active mode operation in progress is implemented by generating a control signal corresponding to the active mode operation in progress, thereby simplifying the configuration of the control circuit, decreasing the area occupied by the control circuit in a semiconductor memory device, and reducing power consumption.

According to one aspect of the present invention, there is provided a semiconductor memory device comprising first buffer unit for outputting a first clock pulse signal by buffering an external clock enable signal inputted when entering a power-down mode; second buffer unit for outputting a second clock pulse signal by buffering an external clock signal; first latch unit for outputting a first clock control signal for controlling internally operating clocks, by latching the first and second clock pulse signals; a control circuit for outputting a second clock control signal for controlling internally operating clocks employed in active mode operation, by using a control signal used in the active mode operation, when a power-down mode entry command is received during the active mode operation; and a clock enable generation circuit for outputting first through third clock enable signals for enabling entry to the power-down mode, by using the first and second clock control signals, when the second clock pulse signal is disabled.

According to another aspect of the present invention, the active mode operation includes at least one of read operation, read operation with an auto-precharge command, write operation, and write operation with an auto-precharge command.

According to another aspect of the present invention, the control circuit comprises an end pulse generation section for outputting an end pulse signal for ending the active mode operation, by buffering the control signal; and a clock control signal generation section for outputting the second clock control signal for controlling end of the active mode operation, by latching the second clock enable signal outputted from the clock enable generation circuit and the end pulse signal.

According to another aspect of the present invention, the control signal is any one of an off signal which is enabled while all corresponding data is inputted in any one of the read operation and the read operation with an auto-precharge command, a blend signal which is enabled when a write data processing time is ended in the write operation, and an auto-precharge signal which is enabled when the auto-precharge command is inputted.

According to another aspect of the present invention, the end pulse generation section comprises third buffer unit for outputting a read/auto-precharge end pulse signal for ending the read operation, by buffering the off signal; fourth buffer unit for outputting a write/auto-precharge end pulse signal for ending any one of the write operation and auto-precharge operation, by selectively buffering the blend signal and the auto-precharge signal depending upon a state of an address signal which is disabled in the write operation and enabled in the auto-precharge operation; and first combining unit for outputting the end pulse signal, by logically combining output signals of the third and fourth buffer unit.

According to another aspect of the present invention, the third buffer unit comprises a first inverter for receiving the off signal which is delayed by delay unit; a first NAND gate for NANDing the off signal and an output signal of the first inverter; and a second inverter for receiving an output signal of the first NAND gate and outputting the read/auto-precharge end pulse signal.

According to another aspect of the present invention, the fourth buffer unit outputs the write/auto-precharge end pulse signal for ending the write operation, by buffering the blend signal when the address signal is enabled, and outputs the write/auto-precharge end pulse signal for ending the auto-precharge operation, by buffering the auto-precharge signal when the address signal is disabled.

According to another aspect of the present invention, the fourth buffer unit comprises a first transfer gate for outputting the blend signal when the address signal is disabled and the auto-precharge signal when the address signal is enabled; a second NAND gate for NANDing a read disable signal which is enabled during the write operation and disabled during the read operation and an output signal of the first transfer gate; and a third inverter for receiving an output signal of the second NAND gate and outputting the write/auto-precharge end pulse signal.

According to another aspect of the present invention, the first combining unit comprises a NOR gate for NORing the read/auto-precharge end pulse signal and the write/auto-precharge end pulse signal; and a fourth inverter for receiving an output signal of the NOR gate and outputting the end pulse signal.

According to another aspect of the present invention, the clock control signal generation section comprises second latch unit for outputting a first latch signal by latching the third clock enable signal, when a CAS pulse signal, which generates a pulse signal when any one of a read command and a write command is received, is enabled; third latch unit for outputting a second latch signal by latching the first latch signal when the end pulse signal is high level; fourth latch unit for outputting a third latch signal by latching the end pulse signal; and second combining unit for outputting the second clock control signal for controlling the end of the active mode operation, by logically combining the second and third latch signals.

According to another aspect of the present invention, the second latch unit comprises a fifth inverter for receiving the CAS pulse signal; a second transfer gate for outputting the second clock enable signal when an output signal of the fifth inverter is low level; a PMOS transistor for determining whether to output a source voltage depending upon a state of a power-up signal which is enabled not in the power-down mode and disabled in the power-down mode; and a first latch for outputting the first latch signal, by latching an output signal of the second transfer gate when the power-up signal is disabled and the source voltage when the power-up signal is enabled.

According to another aspect of the present invention, the third latch unit comprises a third transfer gate for outputting the first latch signal when the end pulse signal is high level; a first NMOS transistor for determining whether to output a ground voltage depending upon a state of the power-up signal which is enabled not in the power-down mode and disabled in the power-down mode; a sixth inverter for receiving the second clock enable signal outputted from the clock enable generation circuit; a second NMOS transistor for determining whether to output the ground voltage depending upon a logic level of a signal outputted from the sixth inverter; and a second latch for outputting the second latch signal by selectively latching an output signal of the third transfer gate and the ground voltage depending upon the output signals of the third transfer gate, the first NMOS transistor and the second NMOS transistor.

According to another aspect of the present invention, the fourth latch unit comprises a seventh inverter for receiving the power-up signal which is enabled not in the power-down mode and disabled in the power-down mode; a third latch for logically combining an output signal of the seventh inverter, the end pulse signal and the CAS pulse signal, and latching a logically combined signal; and an eighth inverter for receiving an output signal of the third latch and outputting the third latch signal.

According to another aspect of the present invention, the second combining unit comprises a third NAND gate for NANDing the second latch signal and the third latch signal; and a fourth NAND gate for NANDing an output signal of the third NAND gate and the second clock enable signal outputted from the clock enable generation circuit, and outputting the second clock control signal.

According to another aspect of the present invention, the clock enable generation circuit comprises a first enable signal generation section for outputting the first clock enable signal by latching the first clock control signal when the second clock pulse signal is low level; a second enable signal generation section for outputting the second clock enable signal by buffering the first clock control signal; and a third enable signal generation section for outputting the third clock enable signal by buffering the second clock control signal.

According to another aspect of the present invention, the first clock enable signal is a signal for turning off command and address buffers, the second clock enable signal is a signal for disabling internally operating clocks excluding those employed in the active mode operation, and the third clock enable signal is a signal for disabling the internally operating clocks employed in the active mode operation.

According to another aspect of the present invention, the first and second clock enable signals are enabled when the power-down mode entry command is received, and the third clock enable signal is enabled when the active mode operation is completed.

According to another aspect of the present invention, the first enable signal generation section comprises a ninth inverter for receiving the power-up signal which is enabled not in the power-down mode and disabled in the power-down mode; a third NMOS transistor for determining whether to output a ground voltage depending upon an output signal of the ninth inverter; a fourth latch for latching the first clock control signal when the power-up signal is disabled and the ground voltage when the power-up signal is enabled; a fourth transfer gate for outputting an output signal of the fourth latch when the second clock pulse signal is low level; a fifth latch for latching an output signal of the fourth transfer gate; and a tenth inverter for receiving an output signal of the fifth latch and outputting the first clock enable signal.

According to still another aspect of the present invention, the second enable signal generation section comprises an eleventh inverter for receiving the first clock control signal when the power-up signal which is enabled not in the power-down mode and disabled in the power-down mode is enabled, and a ground voltage when the power-up signal is disabled; a twelfth inverter for receiving an output signal of the eleventh inverter; and a thirteenth inverter for receiving an output signal of the twelfth inverter and outputting the second clock enable signal.

According to a still further aspect of the present invention, the third enable signal generation section comprises a fourteenth inverter for receiving the second clock control signal; a fifth NAND gate for NANDing the output signal of the eleventh inverter and an output signal of the fourteenth inverter; and a fifteenth inverter for receiving an output signal of the fifth NAND gate and outputting the third clock enable signal.

BRIEF DESCRIPTION OF THE DRAWINGS

These and various other features as well as advantages of the present invention will be apparent after a reading of the following detailed description and a review of the associated drawings, in which.

DETAILED DESCRIPTION OF PREFERRED EMBODIMENTS

Figure 1:
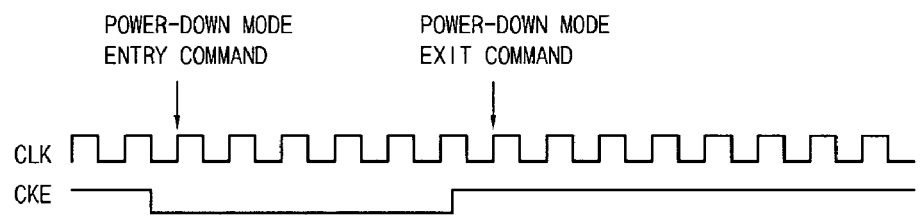
FIG. 1 is a timing diagram on entry to and exit from a power-down mode in a conventional semiconductor memory device.
Figure 2:
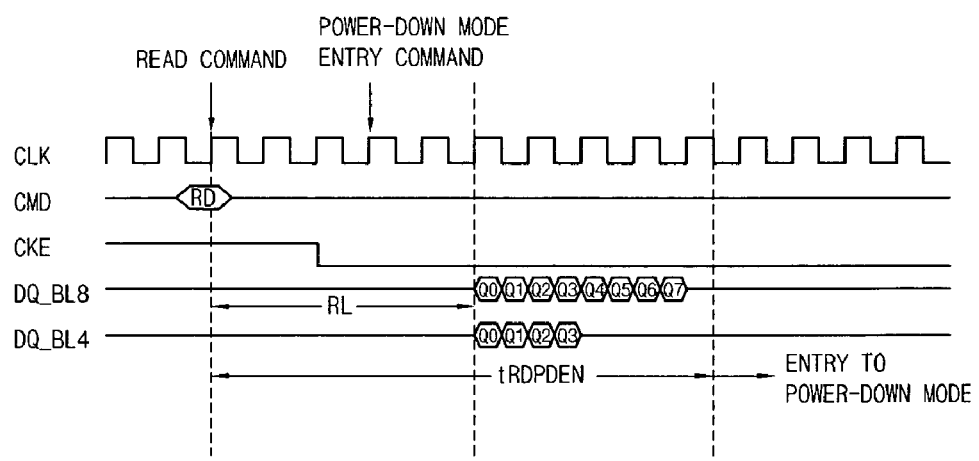
FIG. 2 is a timing diagram explaining entry to the power-down mode from read operation in the conventional semiconductor memory device.
Figure 3:
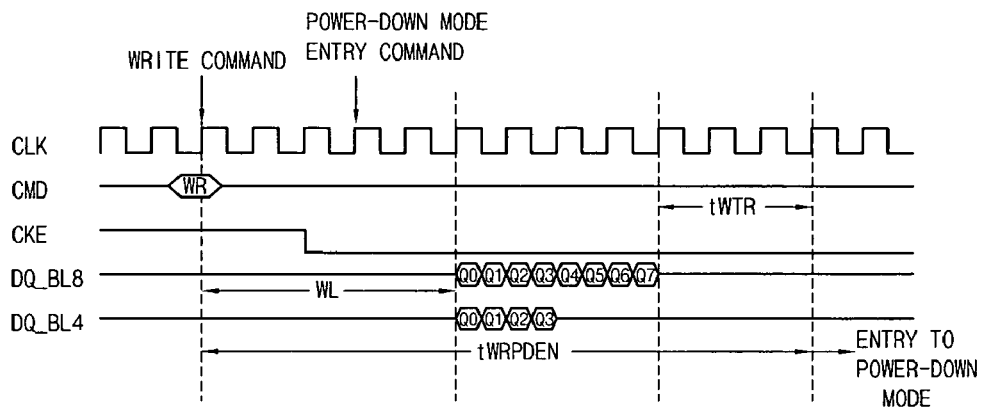
FIG. 3 is a timing diagram explaining entry to the power-down mode from write operation in the conventional semiconductor memory device.
Figure 4:
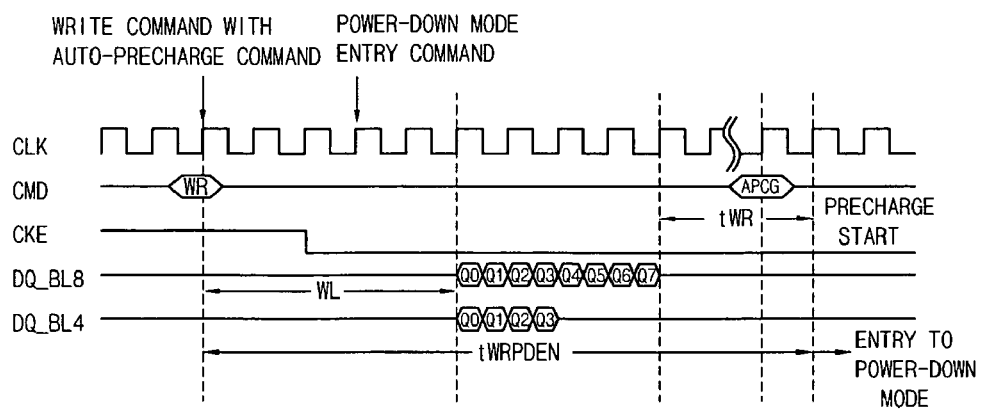
FIG. 4 is a timing diagram explaining entry to the power-down mode from write operation with an auto-precharge command in the conventional semiconductor memory device.
Figure 5:
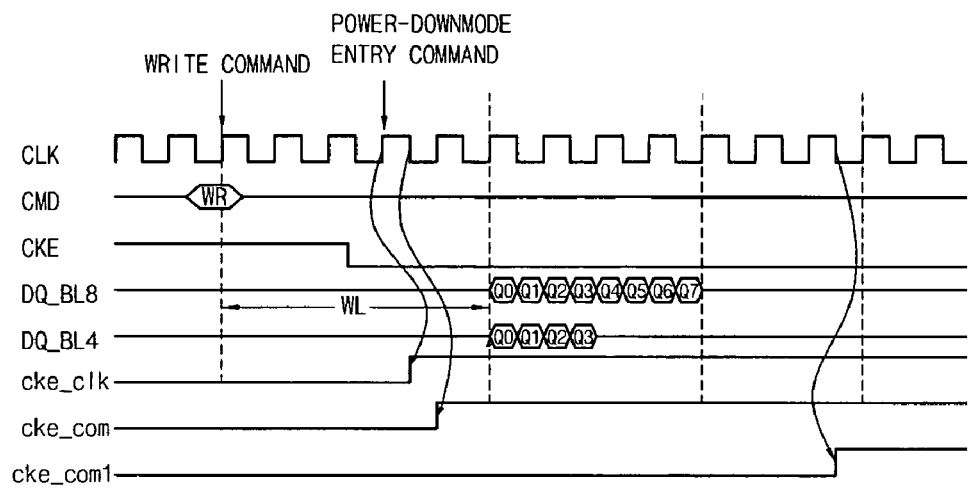
FIG. 5 is a timing diagram explaining operation when a power-down mode entry command is received during operation under an active mode in the conventional semiconductor memory device.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 6:
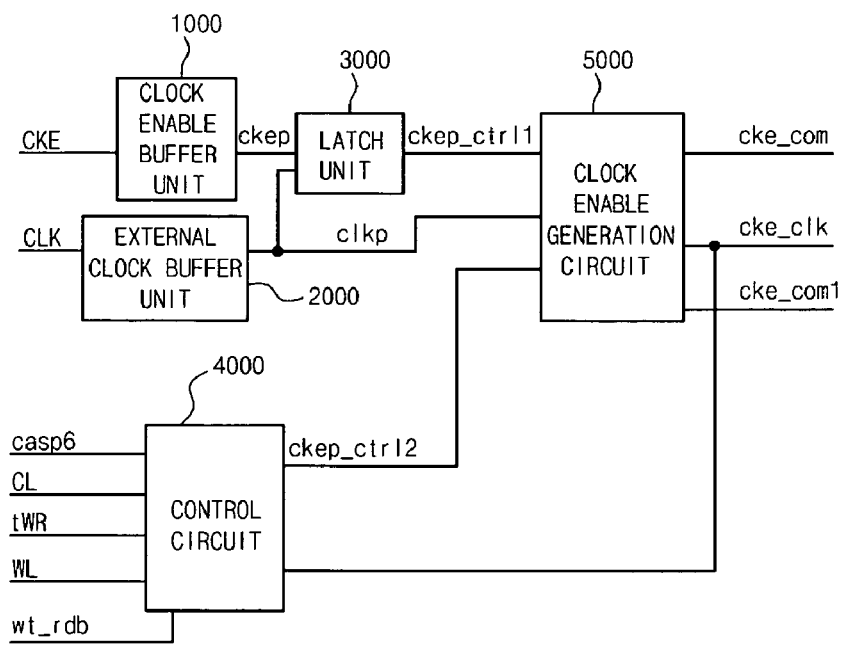
FIG. 6 is a circuit diagram for illustrating a circuit for entry to a power-down mode in a semiconductor memory device in accordance with an embodiment of the present invention.

FIG. 6 is a circuit block diagram for illustrating a circuit for entering into a power-down mode in a semiconductor memory device in accordance with an embodiment of the present invention.

Referring to FIG. 6, a semiconductor memory device according to an embodiment of the present invention includes, inter alia:

(1) a clock enable buffer unit 1000 that receives an external clock enable signal CKE when entering a power-down mode and outputs the inputted CKE signal as a buffered clock enable pulse signal ckep;

(2) an external clock buffer unit 2000 that receives an external clock signal CLK and outputs the inputted CLK signal as a buffered external clock pulse signal clkp;

(3) a latch unit 3000 that outputs a clock control signal cke_ctrl1 for controlling the internally operating clocks by latching the external clock pulse signal clkp and the clock enable pulse signal ckep inputted to the latch unit 3000;

(4) a control circuit 4000 for outputting a clock control signal cke_ctrl2 that controls the internal clocks operating in an active mode operation (i.e., a read operation, a read operation with an auto-precharge command, a write operation, or a write operation with an auto-precharge command) by using the control signals used in the active mode operation when a power-down mode entry command is received during an active mode operation; and (5) a clock enable generation circuit 5000 for outputting clock enable signals cke_com, cke_clk and cke_com1 by using the clock control signals cke_ctrl1 and cke_ctrl2 when the external clock pulse signal clkp is a low level for enabling the entry into the power-down mode.

Figure 7:
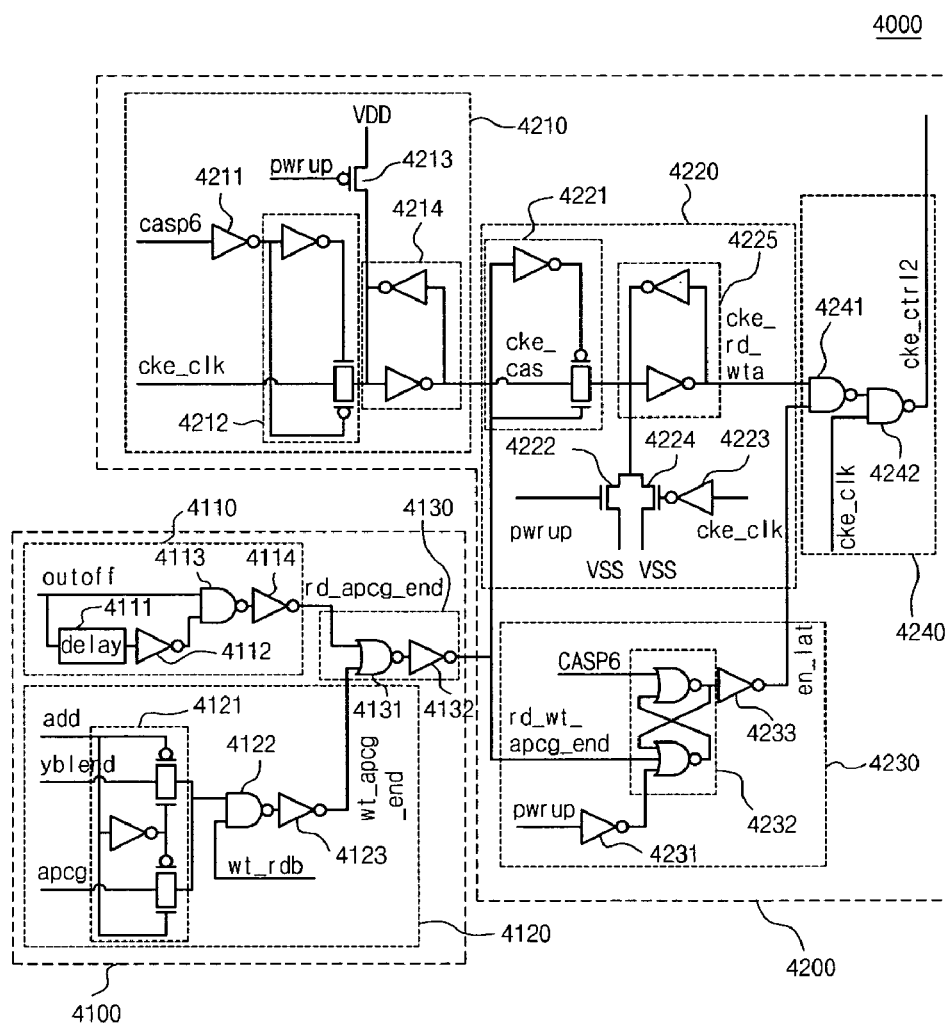
FIG. 7 is a circuit diagram of a power-down mode control circuit according to an embodiment of the present invention.

FIG. 7 is a circuit diagram of a power-down mode control circuit 4000 according to an embodiment of the present invention. Referring to FIG. 7, the control circuit 4000 according to an embodiment of the present invention includes:

(1) an end pulse generation section 4100 that encodes the control signals used in an active mode operation (i.e., an off signal outoff, a write end signal yblend, or an auto-precharge signal apcg) and outputs an end pulse signal rd_wt_apcg_end for ending the active mode operation; and (2) a clock control signal generation section 4200 that outputs the clock control signal cke_ctrl2 for controlling the end of the active mode operation by latching the clock enable signal cke_clk outputted from the clock enable generation circuit 5000 and the end pulse signal rd_wt_apcg_end.

The off signal outoff is enabled (i.e., a low level) while all data is inputted during a read operation or the read operation with an auto-precharge command; the write end signal yblend is enabled (i.e., a high level pulse) after the lapse of a write data processing time tWTR in a write operation; and the auto-precharge signal apcg is enabled (i.e., a high level pulse) when the auto-precharge command is received.

The end pulse generation section 4100 comprises two buffer sections 4110 and 4120 and a combining section 4130. The clock control signal generation section 4200 comprises three latch sections 4210, 4220, and 4230, and one combining section 4240. The sections 4110, 4120, 4130, 4210, 4220, and 4230 can preferably be configured as described below.

The buffer section 4110 in the end pulse generation section 4100 includes: an inverter 4112 for receiving the off signal outoff delayed through a delay element 4111; a NAND gate 4113 performing a logical NAND operation (hereinafter "NANDing") the off signal outoff and the output signal of the inverter 4112; and an inverter 4114 for receiving the output signal of the NAND gate 4113 and outputting a read/auto-precharge end pulse signal rd_apcg_end.

The buffer section 4110 configured in this way receives and buffers the off signal outoff, which is in a low level while all data is being inputted in a read operation or a read operation with an auto-precharge command, and outputs the read/auto-precharge end pulse signal rd_apcg_end.

The buffer section 4120 comprises: a transfer gate 4121 for outputting the write end signal yblend when an address signal add is disabled (i.e., a low level) and the auto-precharge signal apcg when the address signal add is enabled (i.e., a high level); a NAND gate 4122 for NANDing the output signal of the transfer gate 4121 and a read disable signal wt_rdb; and an inverter 4123 for receiving the output signal of the NAND gate 4122 and outputting a write/auto-precharge end pulse signal wt_apcg_end.

Here, the address signal add is disabled during a write operation and enabled during an auto-precharge operation. Also, the read disable signal wt_rdb is enabled (i.e., a high level) during a write operation and is disabled (i.e., a low level) during a read operation.

The buffer section 4120 configured in this way outputs the write/auto-precharge end pulse signal wt_apcg_end for ending the write operation or the auto-precharge operation depending on the logic level of the address signal add. More specifically, when the address signal add is a low level, the buffer section 4120 receives and buffers the write end signal yblend and outputs the write/auto-precharge end pulse signal wt_apcg_end for ending the write operation. When the address signal add is a high level, the buffer section 4120 receives and buffers the auto-precharge signal apcg and outputs the write/auto-precharge end pulse signal wt_apcg_end for ending the auto-precharge operation.

The combining section 4130 comprises: a NOR gate 4131 for performing a logical NOR operation (hereinafter "NORing") the output signal of the inverter 4114 and the output signal of the inverter 4123; and an inverter 4132 for receiving the output signal of the NOR gate 4131 and outputting the end pulse signal rd_wt_apcg_end.

The combining section 4130 configured in this way (1) outputs the end pulse signal rd_wt_apcg_end for ending the read when the read operation is completed, and (2) outputs the end pulse signal rd_wt_apcg_end for ending the write when the write operation is completed, and (3) outputs the end pulse signal rd_wt_apcg_end for ending the auto-precharge when the auto-precharge operation is completed.

Next, in the clock control signal generation section 4200, the latch section 4210 comprises: an inverter 4211 for receiving a CAS pulse signal casp6; a transfer gate 4212 for outputting the clock enable signal cke_clk when the output signal of the inverter 4211 is a low level; a PMOS transistor 4213 for determining whether to output a source voltage VDD depending on the logic level of the power-up signal pwrup; and a latch 4214 for outputting a latch signal cke_cas by latching the output signal of the transfer gate 4212 when the power-up signal pwrup is disabled and the source voltage VDD when the power-up signal pwrup is enabled.

Here, the CAS pulse signal casp6 is enabled (i.e., a high level pulse) in a read or write operation. Also, the power-up signal pwrup is enabled (i.e., a high level) when not in a power-down mode and disabled (i.e., a low level) when in a power-down mode.

The latch section 4210 configured in this way latches the clock enable signal cke_clk when a read or write command is received (that is, when the CAS pulse signal casp6 is enabled and the power up signal pwrup is disabled) and then outputs the latch signal cke_cas when entering into a power-down mode (that is, the power up signal pwrup is enabled) by latching the source voltage VDD. In other words, the latch signal cke_cas outputted from the latch section 4210 is obtained by latching the clock enable signal cke_clk in a read or write operation and then by latching the source voltage VDD in a power-down mode operation.

Moreover, the latch section 4220 comprises: a transfer gate 4221 for outputting the latch signal cke_cas when the end pulse signal rd_wt_apcg_end is a high level; an NMOS transistor 4222 for determining whether to output a ground voltage VSS depending on the logic level of the power-up signal pwrup; an inverter 4223 for receiving the clock enable signal cke_clk outputted from the clock enable generation circuit 5000; an NMOS transistor 4224 for determining whether to output the ground voltage VSS depending upon the logic level of the signal outputted from the inverter 4223; and a latch 4225 for outputting a latch signal cke_rd_wta by selectively latching the output signal of the transfer gate 4221 and the ground voltage VSS depending on the output signals of the transfer gate 4221, the NMOS transistor 4222, and the NMOS transistor 4224.

The latch section 4220 configured in this way (1) latches the ground voltage VSS when the power-up signal pwrup is a high level, then (2) latches the ground voltage VSS when the clock enable signal cke_clk is a low level, and then (3) outputs the latch signal cke_rd_wta by latching the latch signal cke_cas when the end pulse signal rd_wt_apcg_end is outputted from the end pulse generation section 4100. That is, the latch signal cke_rd_wta outputted from the latch section 4220 remains in a high level during an active mode operation and changes to a low level when the active mode operation is ended.

Furthermore, the latch section 4230 comprises: an inverter 4231 for receiving the power-up signal pwrup; a latch 4232 for logically combining the output signal of the inverter 4231, the end pulse signal rd_wt_apcg_end, and the CAS pulse signal casp6 and selectively latching the output signal of the inverter 4231, the end pulse signal rd_wt_apcg_end, and the CAS pulse signal casp6; and an inverter 4233 for receiving the output signal of the latch 4232 and outputting a latch signal en_lat.

The latch section 4230 configured in this way outputs the latch signal en_lat through the inverter 4231, the latch 4232 and the inverter 4233. Namely, the latch signal en_lat outputted from the latch section 4230 is changed from a low level to a high level when the CAS pulse signal casp6 is a high level, and the latch signal en_lat is thereafter changed from a high level to a low level when the output signal of the inverter 4132 is a high level.

Moreover, the combining section 4240 comprises: a NAND gate 4241 for NANDing the latch signal cke_rd_wta and the latch signal en_lat; and a NAND gate 4242 for NANDing the output signal of the NAND gate 4241 and the clock enable signal cke_clk and outputting the clock control signal cke_ctrl2.

The combining section 4240 configured in this way outputs the clock control signal cke_ctrl2 of a low level for controlling the ending of the active mode operation, when both the latch signal cke_rd_wta and the latch signal en_lat are a low level and the clock enable signal cke_clk is a high level.

As described above, the control circuit 4000 according to an embodiment of the present invention outputs the clock control signal cke_ctrl2 through the end pulse generation section 4100 and the clock control signal generation section 4200. Further, the clock control signal cke_ctrl2 outputted from the control circuit 4000 according to an embodiment of the present invention is inputted to the clock enable generation circuit 5000, and is used to generate the clock enable signal cke_com1 for controlling the internally operating clocks employed in the active mode operation.

Figure 8:
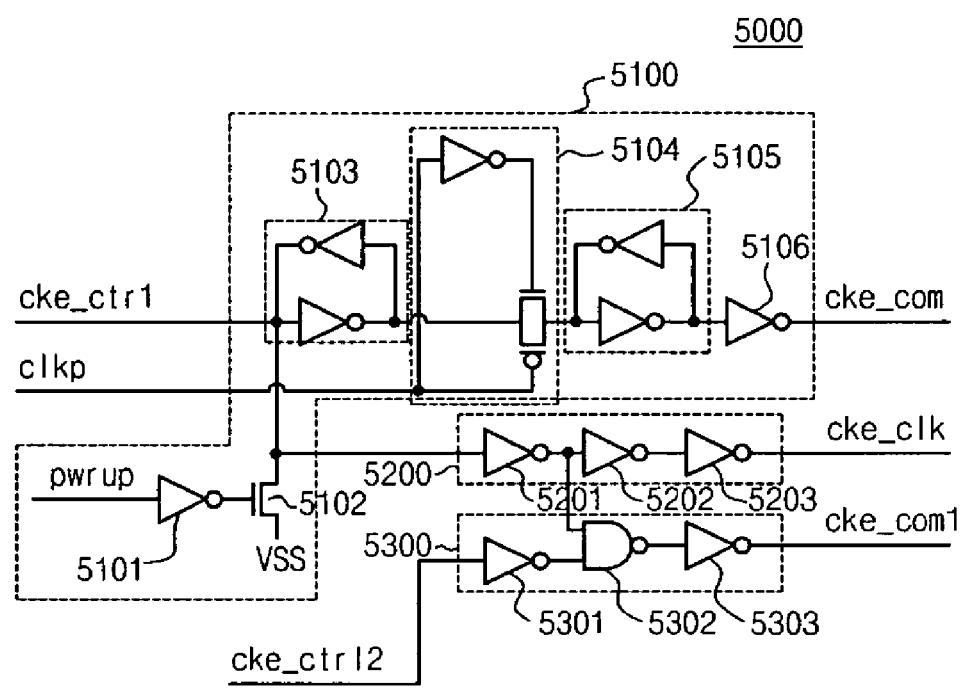
FIG. 8 is a circuit diagram of a clock enable generation circuit according to an embodiment of the present invention.

Referring to FIG. 8, the clock enable generation circuit 5000 according to an embodiment of the present invention comprises:

(1) an enable signal generation section 5100 for outputting the clock enable signal cke_com for turning off the command and address buffers, by latching the clock control signal cke_ctrl1 when the external clock pulse signal clkp is low level;

(2) an enable signal generation section 5200 for outputting the clock enable signal cke_clk for controlling the internally operating clocks excluding those employed in the active mode operation, by buffering the clock control signal cke_ctrl1; and (3) an enable signal generation section 5300 for outputting the clock enable signal cke_com1 for disabling the internally operating clocks employed in the active mode operation, by buffering the clock control signal cke_ctrl2 outputted from the control circuit 4000.

Here, the enable signal generation section 5100 comprises: an inverter 5101 for receiving the power-up signal pwrup; an NMOS transistor 5102 for determining whether to output a ground voltage VSS depending on the output signal of the inverter 5101; a latch 5103 for latching the clock control signal cke_ctrl1 when the power-up signal pwrup is disabled and the ground voltage VSS when the power-up signal pwrup is enabled; a transfer gate 5104 for outputting the output signal of the latch 5103 when the clock pulse signal clkp is a low level; a latch 5105 for latching the output signal of the transfer gate 5104; and an inverter 5106 for receiving the output signal of the latch 5105 and outputting the clock enable signal cke_com.

Also, the enable signal generation section 5200 comprises: an inverter 5201 for receiving the clock control signal cke_ctrl1 when the power-up signal pwrup is disabled and the ground voltage VSS when the power-up signal pwrup is enabled; an inverter 5202 for receiving the output signal of the inverter 5201; and an inverter 5203 for receiving the output signal of the inverter 5202 and outputting the clock enable signal cke_clk.

The enable signal generation section 5300 comprises: an inverter 5301 for receiving the clock control signal cke_ctrl2; a NAND gate 5302 for NANDing the output signal of the inverter 5202 and the output signal of the inverter 5301; and an inverter for receiving the output signal of the NAND gate 5302 and outputting the clock enable signal cke_com1.

As described above and according to an embodiment of the present invention, when entering into a power-down mode, the clock enable signals cke_com, cke_clk, and cke_com1 (which are for turning off the command and address buffers and for disabling all internally operating clocks) are generated through the clock enable buffer unit 1000, the external clock buffer unit 2000, the latch unit 3000, the control circuit 4000, and the clock enable generation circuit 5000. The semiconductor memory device according to an embodiment of the present invention thus operates differently depending on the operation type of a read operation, a read operation with an auto-precharge command, a write operation, or a write operation with an auto-precharge command as described in detail below.

Figure 9:
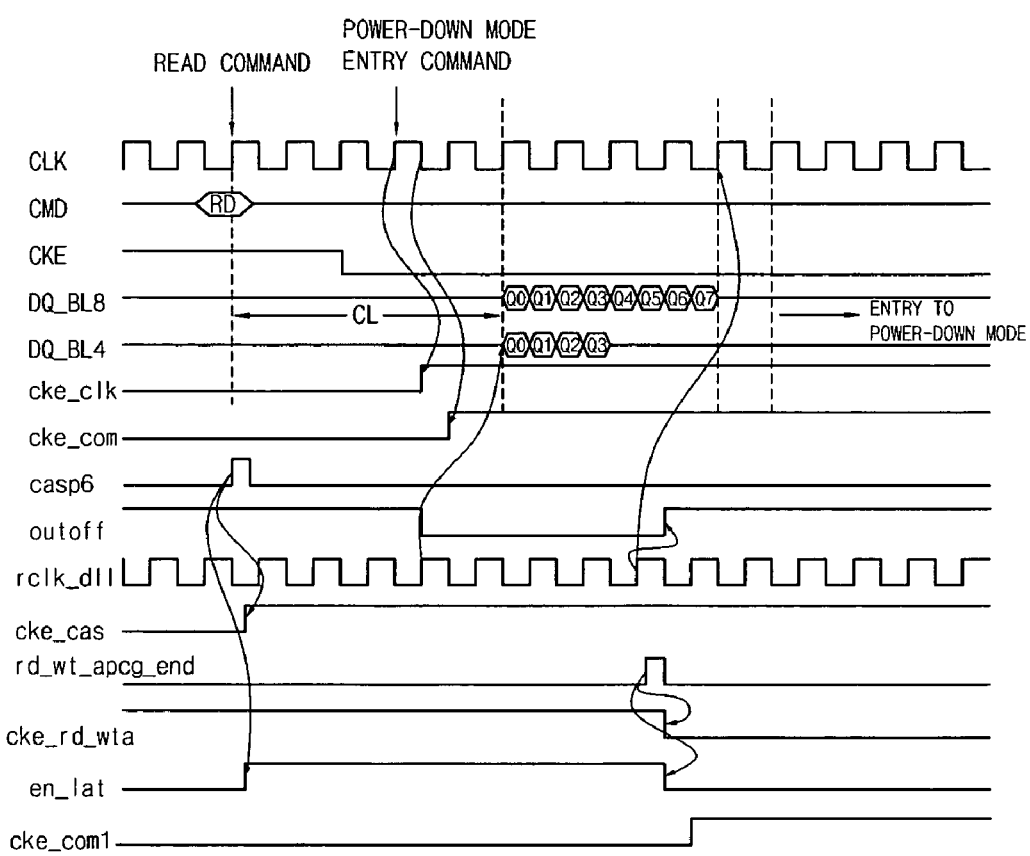
FIG. 9 is a timing diagram explaining entry to the power-down mode from a read operation in the semiconductor memory device according to an embodiment of the present invention.

FIG. 9 is a timing diagram explaining entry to a power-down mode from a read operation in the semiconductor memory device according to an embodiment of the present invention.

As already mentioned above, the operations performed for entering into a power-down mode from a read operation or from a read operation with an auto-precharge command are same, and thus the same descriptions for each of the above will not be redundantly repeated.

Hereafter, the procedure for entering into a power-down mode in a read operation in the semiconductor memory device according to an embodiment of the present invention will be described in detail with reference to FIGS. 7-9.

First, in the semiconductor memory device according to an embodiment of the present invention, when a power-down mode entry command is inputted after a read command RD is inputted but before read data is outputted through an output buffer DQ, the latch section 4210 latches the clock enable signal cke_clk that is outputted from the clock enable generation circuit 5000 using the CAS pulse signal casp6 generated by the read command RD. At this time, since the semiconductor memory device according to an embodiment of the present invention is not operating in the power-down mode, the clock enable signal cke_clk outputted from the clock enable generation circuit 5000 is in a low level. Accordingly, the latch section 4210 latches the clock enable signal cke_clk outputted from the clock enable generation circuit 5000 and outputs the latch signal cke_cas of a high level.

Next, in the semiconductor memory device according to an embodiment of the present invention, the read/auto-precharge end pulse signal rd_apcg_end is generated in the buffer section 4110 at the time the off signal outoff is disabled. Here, the off signal outoff remains in a high level when being disabled but becomes enabled (i.e., changes to a low level) when outputting data to the output buffer DQ. Then, the off signal outoff is disabled by a DLL clock rclk_dll after outputting the data by a burst length. Next, the combining section 4130 outputs the end pulse signal rd_wt_apcg_end, which is the same as the read/auto-precharge end pulse signal rd_apcg_end.

Thereupon, the latch section 4220 of the semiconductor memory device according to an embodiment of the present invention generates the latch signal cke_rd_wta by latching the latch signal cke_cas using the end pulse signal rd_wt_apcg_end. At this time, the latch signal cke_rd_wta is changed to a low level through the latch 4225. Accordingly, the clock control signal cke_ctrl2 is changed to a low level through the combining section 4240, and thereafter, the clock enable signal cke_com1 is changed to a high level through the enable signal generation section 5300.

Figure 10:
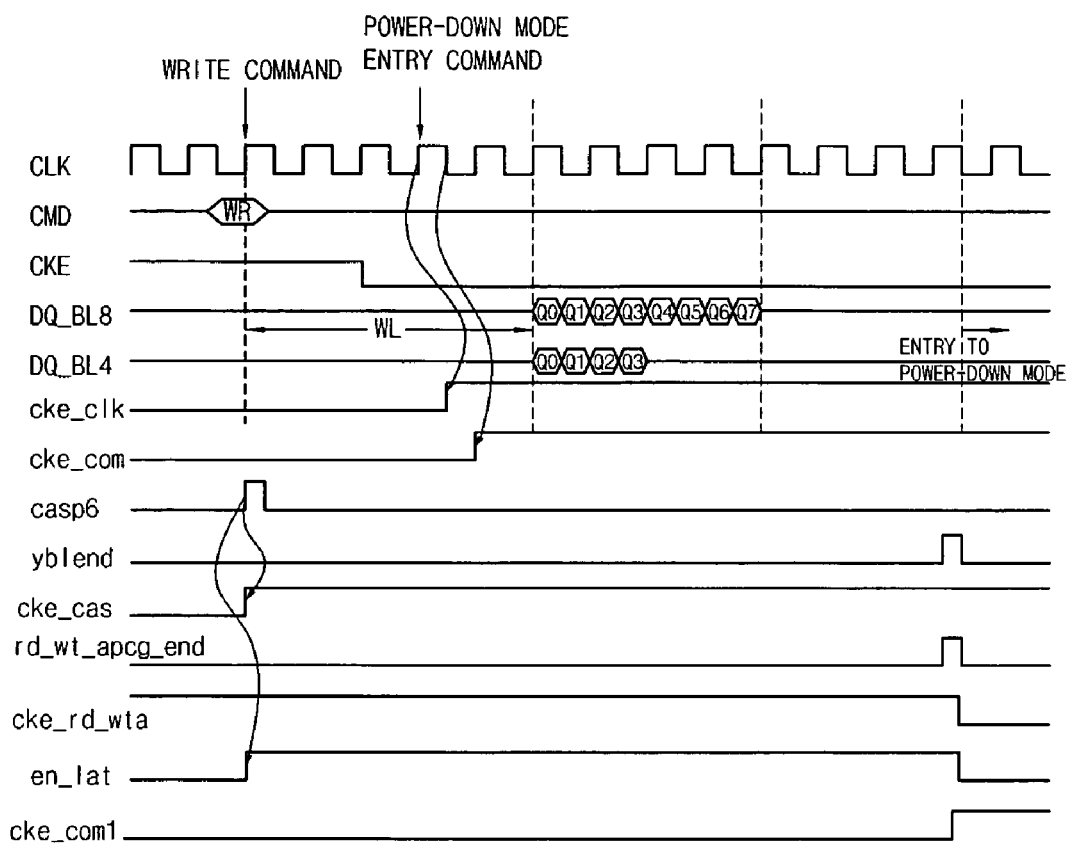
FIG. 10 is a timing diagram explaining entry to the power-down mode from a write operation in the semiconductor memory device according to an embodiment of the present invention.
Figure 11:
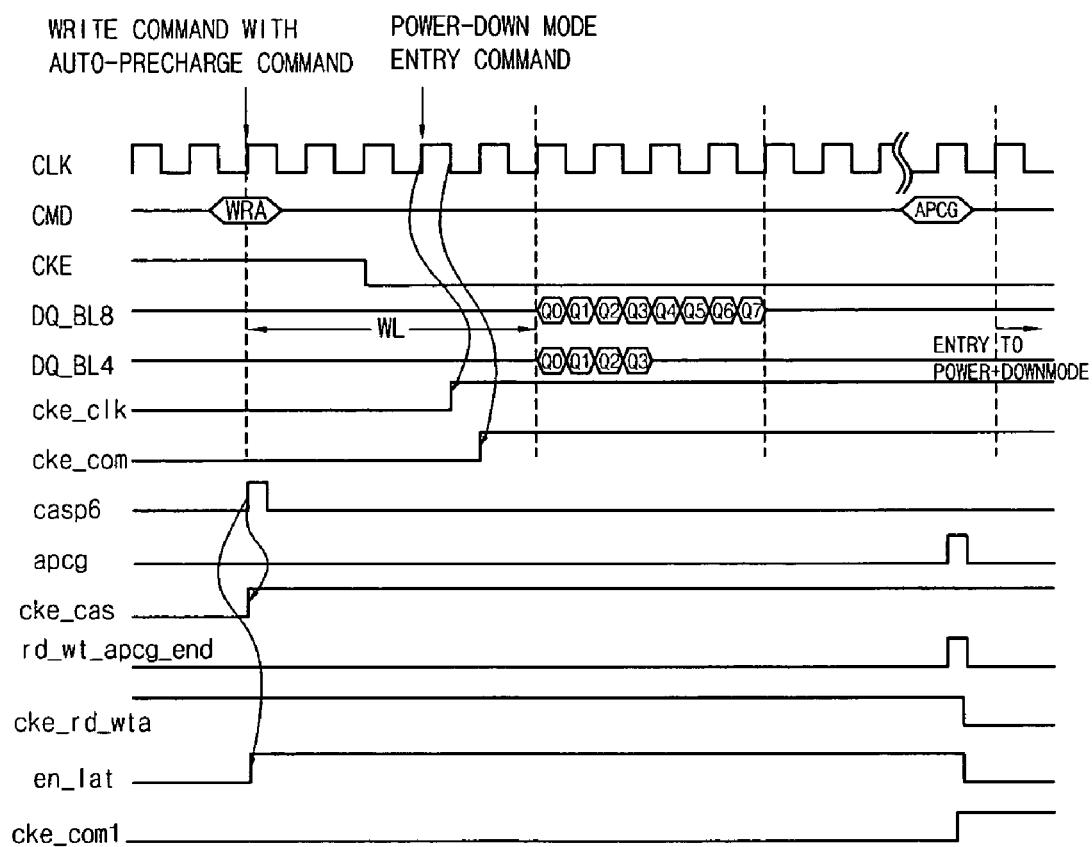
FIG. 11 is a timing diagram explaining entry to the power-down mode from a write operation with an auto-precharge command in the semiconductor memory device according to an embodiment of the present invention.

FIG. 10 is a timing diagram explaining entry to the power-down mode from a write operation in the semiconductor memory device according to an embodiment of the present invention, and FIG. 11 is a timing diagram explaining entry to the power-down mode from a write operation with an auto-precharge command in the semiconductor memory device according to an embodiment of the present invention.

As shown in FIG. 10, in the semiconductor memory device according to an embodiment of the present invention, the entry to the power-down mode in a write operation is implemented basically in the same manner as the entry to the power-down mode in a read operation, but the write end signal yblend is used in place of the off signal outoff. Here, the write end signal yblend is a signal that generates a high level pulse after a series of operations—more specifically, after a write command followed by an lapse of a write latency WL, which is followed by inputting of data by a burst length, and thereafter the lapse of the write data processing time tWTR.

Therefore, when a power-down mode entry command is inputted during a write operation, the semiconductor memory device according to an embodiment of the present invention enters into the power-down mode after a series of operations—more specifically, after the write command is inputted using the write end signal yblend, and after the lapse of the write latency WL, followed by inputting of the data by the burst length, and thereafter the lapse of the write data processing time tWTR.

Further, as shown in FIG. 11, in the semiconductor memory device according to an embodiment of the present invention, the entry to the power-down mode in a write operation with an auto-precharge command is implemented basically in the same manner as the entry to the power-down mode in a write operation, but the auto-precharge signal apcg is used in place of the write end signal yblend.

That is, when the power-down mode entry command is inputted during a write operation with an auto-precharge command, the semiconductor memory device according to an embodiment of the present invention enters into a power down mode after the write operation is ended using the auto-precharge signal apcg and after one clock calculated based on the clock for performing auto-precharge.

Hence, in order to enter into a power-down mode during an active mode operation, the semiconductor device according to an embodiment of the present invention generates the clock enable signal cke_com1 of a high level after all active mode operations are ended and disables the clock signals used in the active mode operation.

At this time, the semiconductor memory device according to an embodiment of the present invention utilizes the read disable signal wt_rdb in order to distinguish the write operation with an auto-precharge command and the read operation with an auto-precharge command.

Describing this in detail with reference to FIGS. 7-11, the buffer section 4120 outputs the write/auto-precharge end pulse signal wt_apcg_end of a high level only when the power-down mode entry command is inputted during a write operation or a write operation with an auto-precharge command through the NAND gate 4122.

In other words, in the event the power-down mode entry command is inputted during a write operation, the NAND gate 4122 NANDs the write end signal yblend and the read disable signal wt_rdb and outputs a low level signal. Thereafter, the inverter 4123 inverts the output signal of the NAND gate 4122 and outputs the write/auto-precharge end pulse signal wt_apcg_end of a high level.

Similarly, in the event the power-down mode entry command is inputted during a write operation with an auto-precharge command, the NAND gate 4122 NANDs the auto-precharge signal apcg and the read disable signal wt_rdb and outputs a low level signal. Thereafter, the inverter 4123 inverts the output signal of the NAND gate 4122 and outputs the write/auto-precharge end pulse signal wt_apcg_end of a high level.

On the other hand, the semiconductor memory device according to an embodiment of the present invention does not generate the clock enable signal cke_com1 when it enters a power-down mode without a read operation, a read operation with an auto-precharge command, a write operation, or a write operation with an auto-precharge command.

Describing this in detail with reference to FIGS. 7 through 11, in the case of entering a power-down mode without a read operation, a read operation with an auto-precharge command, a write operation, or a write operation with an auto-precharge command, the end pulse generation section 4100 outputs the end pulse signal rd_wt_apcg_end of a low level. Since the transfer gate 4221 of the latch section 4220 is turned off and does not output the latch signal cke_cas, the control circuit 4000 does not output the clock control signal cke_ctrl2.

As described above, the semiconductor memory device according to an embodiment of the present invention realizes the control circuit 4000, which is simpler than the conventional counterpart, to perform operations utilizing the control signals of an active mode operation in the event a power-down mode entry command is inputted during the active mode operation. Namely, in the event a power-down mode entry command is inputted during an active mode operation, all internally operating clocks used in the active mode operation are disabled through the control circuit 4000, which receives the control signals employed in the active mode operation.

Consequently, in the event a power-down mode entry command is inputted during an active mode operation, all clocks used in the active mode operation can be disabled through the control circuit 4000 having the simple configuration without the need to count any of the CAS pulse signal casp6, the CAS latency CL, the write latency WL and the write recovery time tWR using a plurality of D flip-flops and multiplexers.

As a result, the semiconductor memory device according to an embodiment of the present invention reduces the area occupied by the control circuit 4000 and lowers the current consumption by utilizing the control circuit 4000 that is simpler in design and utilizes the control signals employed in an active mode operation.

As is apparent from the above description, the present invention does not require a control circuit, which comprises a plurality of separate D flip-flops for counting a CAS pulse signal casp6, a CAS latency CL, a write latency WL and a write recovery time tWR, and a plurality of separate multiplexers, to operate in response to a power down-mode entry command received during an active mode operation. Instead, the present invention provides a simple control circuit configured to utilize the control signals employed in an active mode operation to operate when a power-down mode entry command is received during an active mode operation. As a result, the area occupied by the control circuit according to the present invention is less, and the amount of power consumed is less.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor memory device comprising:
   a first buffer unit outputting a first clock pulse signal by buffering an external clock enable signal inputted when entering a power-down mode;
   a second buffer unit outputting a second clock pulse signal by buffering an external clock signal;
   a first latch unit outputting a first clock control signal for controlling internally operating clocks, by latching the first and second clock pulse signals;
   a control circuit outputting a second clock control signal when a power-down mode entry command is received during an active mode operation, wherein the second clock control signal utilizes a control signal used in the active mode operation for controlling internally operating clocks employed in the active mode operation; and
   a clock enable generation circuit outputting a first clock enable signal, a second clock enable signal, and a third clock enable signal, all of which are for enabling an entry into a power-down mode by using the first and second clock control signals when the second clock pulse signal is disabled.

2. The device of claim 1, wherein the active mode operation includes at least one of a read operation, a read operation with an auto-precharge command, a write operation, and a write operation with an auto-precharge command.

3. The device of claim 2, wherein the control circuit comprises:
   an end pulse generation section for outputting an end pulse signal for ending the active mode operation, by buffering an input control signal; and
   a clock control signal generation section for outputting the second clock control signal for controlling the end of the active mode operation, by latching the second clock enable signal outputted from the clock enable generation circuit and the end pulse signal.

4. The device of claim 3, wherein the input control signal is any one of:
   an off signal which is enabled while all corresponding data is inputted in any one of the read operation and the read operation with an auto-precharge command;
   a blend signal which is enabled when a write data processing time is ended in the write operation;
   and an auto-precharge signal which is enabled when the auto-precharge command is inputted.

5. The device of claim 4, wherein the end pulse generation section comprises:
   a third buffer unit outputting a read/auto-precharge end pulse signal for ending the read operation, by buffering the off signal;
   a fourth buffer unit outputting a write/auto-precharge end pulse signal for ending any one of the write operation and auto-precharge operation, by selectively buffering the blend signal and the auto-precharge signal depending on a state of an address signal which is disabled in a write operation and enabled in a auto-precharge operation; and
   a first combining unit outputting the end pulse signal, by logically combining output signals of the third and fourth buffer units.

6. The device of claim 5, wherein the third buffer unit comprises:
   a first inverter receiving the off signal delayed by a delay unit;
   a first NAND gate performing a logical NAND operation on the off signal and an output signal of the first inverter; and
   a second inverter receiving the output signal of the first NAND gate and outputting the read/auto-precharge end pulse signal.

7. The device of claim 5, wherein the fourth buffer unit outputs the write/auto-precharge end pulse signal for ending the write operation, by buffering the blend signal when the address signal is enabled, and outputs the write/auto-precharge end pulse signal for ending the auto-precharge operation, by buffering the auto-precharge signal when the address signal is disabled.

8. The device of claim 7, wherein the fourth buffer unit comprises:
- a first transfer gate outputting the blend signal when the address signal is disabled or outputting the auto-precharge signal when the address signal is enabled;
- a second NAND gate performing a logical NAND operation on a read disable signal, which is enabled during the write operation and disabled during the read operation, and an output signal of the first transfer gate; and
- a third inverter for receiving an output signal of the second NAND gate and outputting the write/auto-precharge end pulse signal.

9. The device of claim 5, wherein the first combining unit comprises:
- a NOR gate for performing a logical NOR operation on the read/auto-precharge end pulse signal and the write/auto-precharge end pulse signal; and
- a fourth inverter receiving an output signal of the NOR gate and outputting the end pulse signal.

10. The device of claim 4, wherein the clock control signal generation section comprises:
- a second latch unit outputting a first latch signal by latching the third clock enable signal, when a CAS pulse signal, which generates a pulse signal when any one of a read command and a write command is received, is enabled;
- a third latch unit outputting a second latch signal by latching the first latch signal when the end pulse signal is high level;
- a fourth latch unit outputting a third latch signal by latching the end pulse signal; and
- a second combining unit outputting the second clock control signal for controlling the end of the active mode operation, by logically combining the second and third latch signals.

11. The device of claim 10, wherein the second latch unit comprises:
- a fifth inverter receiving the CAS pulse signal;
- a second transfer gate outputting the second clock enable signal when an output signal of the fifth inverter is low level;
- a PMOS transistor determining whether to output a source voltage depending upon a state of a power-up signal which is enabled not in the power-down mode and disabled in the power-down mode; and
- a first latch outputting the first latch signal, by latching an output signal of the second transfer gate when the power-up signal is disabled and the source voltage when the power-up signal is enabled.

12. The device of claim 10, wherein the third latch unit comprises:
- a third transfer gate outputting the first latch signal when the end pulse signal is high level;
- a first NMOS transistor determining whether to output a ground voltage depending upon a state of the power-up signal which is enabled not in the power-down mode and disabled in the power-down mode;
- a sixth inverter receiving the second clock enable signal outputted from the clock enable generation circuit;
- a second NMOS transistor determining whether to output the ground voltage depending upon a logic level of a signal outputted from the sixth inverter; and
- a second latch outputting the second latch signal by selectively latching an output signal of the third transfer gate and the ground voltage depending upon the output signals of the third transfer gate, the first NMOS transistor and the second NMOS transistor.

13. The device of claim 10, wherein the fourth latch unit comprises:
- a seventh inverter receiving the power-up signal which is enabled not in the power-down mode and disabled in the power-down mode;
- a third latch logically combining an output signal of the seventh inverter, the end pulse signal and the CAS pulse signal, and latching a logically combined signal; and
- an eighth inverter receiving an output signal of the third latch and outputting the third latch signal.

14. The device of claim 10, wherein the second combining unit comprises:
- a third NAND gate performing a logical NAND operation on the second latch signal and the third latch signal; and
- a fourth NAND gate performing a logical NAND operation on an output signal of the third NAND gate and the second clock enable signal outputted from the clock enable generation circuit, and outputting the second clock control signal.

15. The device of claim 3, wherein the clock enable generation circuit comprises:
- a first enable signal generation section outputting the first clock enable signal by latching the first clock control signal when the second clock pulse signal is low level;
- a second enable signal generation section outputting the second clock enable signal by buffering the first clock control signal; and
- a third enable signal generation section outputting the third clock enable signal by buffering the second clock control signal.

16. The device of claim 15, wherein the first clock enable signal turns off command and address buffers, wherein the second clock enable signal disables internally operating clocks excluding those employed in the active mode operation, and wherein the third clock enable signal disables the internally operating clocks employed in the active mode operation.

17. The device of claim 16, wherein the first and second clock enable signals are enabled when the power-down mode entry command is received, and the third clock enable signal is enabled when the active mode operation is completed.

18. The device of claim 16, wherein the first enable signal generation section comprises:
- a ninth inverter receiving the power-up signal which is enabled not in the power-down mode and disabled in the power-down mode;
- a third NMOS transistor determining whether to output a ground voltage depending upon an output signal of the ninth inverter;
- a fourth latch latching the first clock control signal when the power-up signal is disabled and the ground voltage when the power-up signal is enabled;
- a fourth transfer gate outputting an output signal of the fourth latch when the second clock pulse signal is low level;
- a fifth latch latching an output signal of the fourth transfer gate; and
- a tenth inverter receiving an output signal of the fifth latch and outputting the first clock enable signal.

19. The device of claim 16, wherein the second enable signal generation section comprises:
- an eleventh inverter receiving the first clock control signal when the power-up signal which is enabled not in the power-down mode and disabled in the power-down mode is enabled, and a ground voltage when the power-up signal is disabled;

a twelfth inverter receiving an output signal of the eleventh inverter; and a thirteenth inverter receiving an output signal of the twelfth inverter and outputting the second clock enable signal.

20. The device of claim 19, wherein the third enable signal generation section comprises:

a fourteenth inverter receiving the second clock control signal;

a fifth NAND gate performing a logical NAND operation on the output signal of the eleventh inverter and an output signal of the fourteenth inverter; and a fifteenth inverter for receiving an output signal of the fifth NAND gate and outputting the third clock enable signal.

* * * * *